US011177810B2

(12) United States Patent
Kuo et al.

(10) Patent No.: US 11,177,810 B2
(45) Date of Patent: *Nov. 16, 2021

(54) ALL-DIGITAL PHASE LOCKED LOOP USING SWITCHED CAPACITOR VOLTAGE DOUBLER

(71) Applicant: Taiwan Semiconductor Manufacturing Co., Ltd., Hsinchu (TW)

(72) Inventors: Feng Wei Kuo, Hsinchu County (TW); Chewn-Pu Jou, Hsinchu (TW); Huan-Neng Chen, Taichung (TW); Lan-Chou Cho, Hsinchu (TW); Robert Bogdan Staszewski, Dublin (IE); Seyednaser Pourmousavian, Dublin (IE)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/112,450

(22) Filed: Dec. 4, 2020

(65) Prior Publication Data

US 2021/0091770 A1 Mar. 25, 2021

Related U.S. Application Data

(63) Continuation of application No. 16/429,774, filed on Jun. 3, 2019, now Pat. No. 10,862,486, which is a
(Continued)

(51) Int. Cl.
*H03L 7/06* (2006.01)
*H03L 1/00* (2006.01)
(Continued)

(52) U.S. Cl.
CPC .............. *H03L 1/00* (2013.01); *G04F 10/005* (2013.01); *H03L 7/0805* (2013.01); *H03L 7/093* (2013.01);
(Continued)

(58) Field of Classification Search
CPC .. H02M 3/073; H02M 3/07; H02M 2003/077; G11C 5/145; G05F 3/205;
(Continued)

(56) References Cited

U.S. PATENT DOCUMENTS 8,570,082 B1 * 10/2013 Kuo ........................ H03L 7/16
327/158
9,634,826 B1 4/2017 Park et al.
(Continued)

OTHER PUBLICATIONS

Kuo, et al., A 0.5V 1.6mW 2.4GHz Fractional-N All-Digital PLL for Bluetooth LE with PVT-Insensitive TDC using Switched-Capacitor Doubler in 28nm CMOS:.

*Primary Examiner* — Quan Tra
*Assistant Examiner* — Anh-Quan Tra
(74) *Attorney, Agent, or Firm* — Sterne, Kessler, Goldstein & Fox P.L.L.C.

(57) ABSTRACT

An all-digital phase locked loop (ADPLL) receives an analog input supply voltage which is utilized to operate analog circuitry within the ADPLL. The ADPLL of the present disclosure scales this analog input supply voltage to provide a digital input supply voltage which is utilized to operate digital circuitry within the ADPLL. The analog circuitry includes a time-to-digital converter (TDC) to measure phase errors within the ADPLL. The TDC can be characterized as having a resolution of the TDC which is dependent, at least in part, upon the digital input supply voltage. In some situations, process, voltage, and/or temperature (PVT) variations within the ADPLL can cause the digital input supply voltage to fluctuate, which in turn, can (Continued)

cause fluctuations in the resolution of the TDC. These fluctuations in the resolution of the TDC can cause in-band phase noise of the ADPLL to vary across the PVT variations. The digital circuitry regulates the digital input supply voltage to stabilize the resolution of the TDC across the PVT variations. This stabilization of the resolution of the TDC can cause the ADPLL to maintain a fixed in-band phase noise across the PVT variations.

20 Claims, 5 Drawing Sheets

Related U.S. Application Data continuation of application No. 15/965,110, filed on Apr. 27, 2018, now Pat. No. 10,326,454.

(60) Provisional application No. 62/514,402, filed on Jun. 2, 2017.

(51) Int. Cl.
*G04F 10/00* (2006.01)
*H03L 7/099* (2006.01)
*H03L 7/093* (2006.01)
*H03L 7/08* (2006.01)

(52) U.S. Cl.
CPC ............ *H03L 7/099* (2013.01); *H03L 7/0991* (2013.01); *H03L 2207/06* (2013.01); *H03L 2207/50* (2013.01)

(58) Field of Classification Search
CPC ......... H03L 7/0891; H03L 7/18; H03L 7/093; H03L 7/087; H03L 7/10
USPC ................................ 327/156, 158, 161, 536
See application file for complete search history.

(56) References Cited

U.S. PATENT DOCUMENTS

| | | |
|---|---|---|
| 2004/0152484 A1 | 8/2004 | Pratt |
| 2011/0007859 A1 | 1/2011 | Ueda et al. |
| 2015/0145567 A1 | 5/2015 | Perrott |
| 2018/0138911 A1 | 5/2018 | Kuo et al. |
| 2019/0052278 A1* | 2/2019 | Pandita ............... G06F 1/08 |
| 2019/0288692 A1 | 9/2019 | Kuo et al. |

* cited by examiner

ALL-DIGITAL PHASE LOCKED LOOP USING SWITCHED CAPACITOR VOLTAGE DOUBLER

CROSS-REFERENCE TO RELATED APPLICATIONS

The present application is a continuation of U.S. patent application Ser. No. 16/429,774, filed Jun. 3, 2019, now U.S. Pat. No. 10,862,486, which is a continuation of U.S. patent application Ser. No. 15/965,110, filed Apr. 27, 2018, now U.S. Pat. No. 10,326,454, which claims the benefit of U.S. Provisional Patent Appl. No. 62/514,402, filed Jun. 2, 2017, each of which is incorporated herein by reference in its entirety.

BACKGROUND

The Internet of Things (IoT) represents an ever-growing inter-network of physical devices, vehicles, buildings, and/or things that are embedded with electronics, software, sensors, actuators, and network connectivity which enable these devices, vehicles, buildings, and/or things to exchange data. These physical devices, vehicles, buildings, and/or things collect information and then autonomously communicate this information to other physical devices, vehicles, buildings, and/or things. As such, these physical devices, vehicles, buildings, and/or things include transmitters for transmitting this information to the other physical devices, vehicles, buildings, and/or things and receivers for receiving other information from the other physical devices, vehicles, buildings, and/or things. For example, lighting systems, heating systems, ventilation systems, air conditioning systems, and/or household appliances can include transmitters for communicating information relating to their status to mobile communication devices, such as mobile telephony devices, for example, mobile phones, mobile computing devices, mobile internet devices, for example, tablet computers and/or laptop computers. These lighting systems, heating systems, ventilation systems, air conditioning systems, and/or household appliances can include receivers for receiving information relating to their control from the mobile communication devices. At the heart of these transmitters and receivers lies a phase locked loop (PLL) for providing the signals necessary for transmitting this information to the other physical devices, vehicles, buildings, and/or things and for receiving the other information from the other physical devices, vehicles, buildings, and/or things.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
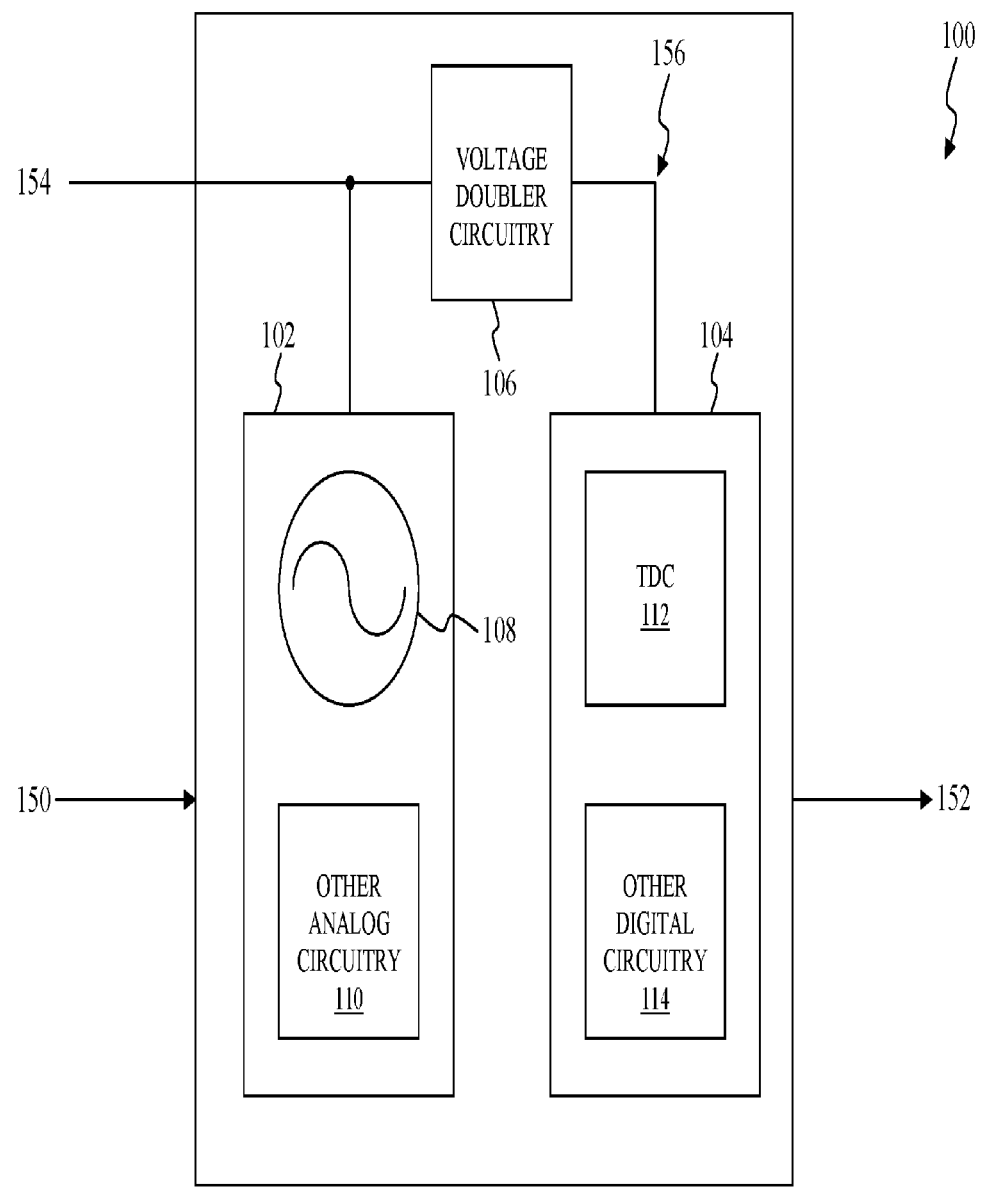
FIG. 1 illustrates a block diagram of an all-digital phase locked loop (ADPLL) according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations discussed.

Overview

An all-digital phase locked loop (ADPLL) receives an analog input supply voltage which is utilized to operate analog circuitry within the ADPLL. The ADPLL of the present disclosure scales this analog input supply voltage to provide a digital input supply voltage which is utilized to operate digital circuitry within the ADPLL. The analog circuitry includes a time-to-digital converter (TDC) to measure phase errors within the ADPLL. The TDC can be characterized as having a resolution of the TDC which is dependent, at least in part, upon the digital input supply voltage. In some situations, process, voltage, and/or temperature (PVT) variations within the ADPLL can cause the digital input supply voltage to fluctuate, which in turn, can cause fluctuations in the resolution of the TDC. These fluctuations in the resolution of the TDC can cause in-band phase noise of the ADPLL to vary across the PVT variations. The digital circuitry regulates the digital input supply voltage to stabilize the resolution of the TDC across the PVT variations. This stabilization of the resolution of the TDC can cause the ADPLL to maintain a fixed in-band phase noise across the PVT variations.

Exemplary all-Digital Phase Locked Loop (ADPLL)

FIG. 1 illustrates a block diagram of an all-digital phase locked loop (ADPLL) according to an exemplary embodiment of the present disclosure. An all-digital phase lock loop (ADPLL) 100 represents a closed-loop feedback control system for providing an output signal 152 which is proportional to a reference input signal 150. Although the present disclosure is to be described in terms of an ADPLL, those skilled in the relevant art(s) will recognize the teachings herein are applicable to other types of PLLs, such as an analog or linear PLL (APLL) or a digital PLL (DPLL) to provide some examples, without departing from the spirit and scope of the present disclosure. As illustrated in FIG. 1, the ADPLL 100 utilizes a combination of analog circuitry 102 and digital circuitry 104 to cause a frequency $f_{OUT}$ and/or a phase $\phi_{OUT}$ of the output signal 152 to be proportional to a frequency $f_{REF}$ and/or a phase $\phi_{REF}$ of the reference input signal 150.

Generally, the analog circuitry 102 operates on time-varying signals within the ADPLL 100. The analog circuitry 102 can include one or more resistors, one or more capacitors, one or more inductors, one or more diodes, and/or one or more transistors to provide some examples. In the exemplary embodiment illustrated in FIG. 1, the analog circuitry 102 includes the digital oscillator 108 to provide the output signal 152 which is proportional the reference input signal 150 and other analog circuitry 110. The other analog circuitry 110 can include one or more analog circuits, such as an analog buffer amplifier to provide an example, to assist the digital oscillator 108 to provide the output signal 152. In the exemplary embodiment illustrated in FIG. 1, the analog circuitry 102 receives the analog input supply voltage 154 which is needed to operate on the time-varying signals within the ADPLL 100.

The digital circuitry 104 operates on discrete signals representing logical and/or numeric values within the ADPLL 100. The digital circuitry 104 can include one or more logic gates to provide one or more Boolean logic functions, such as AND, OR, XOR, XNOR, and/or NOT to provide some examples, or a storage function, such as a flip-flop or a latch to provide some examples. In the exemplary embodiment illustrated in FIG. 1, the digital circuitry 104 includes a time-to-digital converter (TDC) 112 to measure a phase error between the reference signal 150 and the output signal 152 and other digital circuitry 114. The other digital circuitry 114 can include one or more digital circuits, such as digital combination circuitry, digital filtering circuitry, and/or digital dividing circuitry to provide some examples, to assist the TDC 112 to measure the difference between the reference signal 150 and the output signal 152. In the exemplary embodiment illustrated in FIG. 1, the digital circuitry 104 receives the digital input supply voltage 156 which is needed to operate on the discrete signals within the ADPLL 100.

Moreover, the ADPLL 100 additionally includes voltage doubler circuitry 106 to scale an analog input supply voltage 154 by a numerical factor, such as approximately two to provide an example, to provide a digital input supply voltage 156. In an exemplary embodiment, the voltage doubler circuitry 106 scales the analog input supply voltage 154 of approximately 0.5 $V_{DC}$ to provide the digital input supply voltage 156 at approximately 1.0 $V_{DC}$. In this exemplary embodiment, a resolution of the TDC 112 is dependent, at least in part, upon the digital input supply voltage 156. In some situations, process, voltage, and/or temperature (PVT) variations within the ADPLL 100 can cause the digital input supply voltage 156 to fluctuate, which in turn, can cause fluctuations in the resolution of the TDC 112. These fluctuations in the resolution of the TDC 112 can cause in-band phase noise of the ADPLL 100 to vary across the PVT variations. The other digital circuitry 114, as described above, can include one or more digital circuits to regulate the digital input supply voltage 156 to stabilize the resolution of the TDC 112 across the PVT variations. This stabilization of the resolution of the TDC 112 can cause the ADPLL 100 to maintain a fixed in-band phase noise across the PVT variations.

Figure 2:
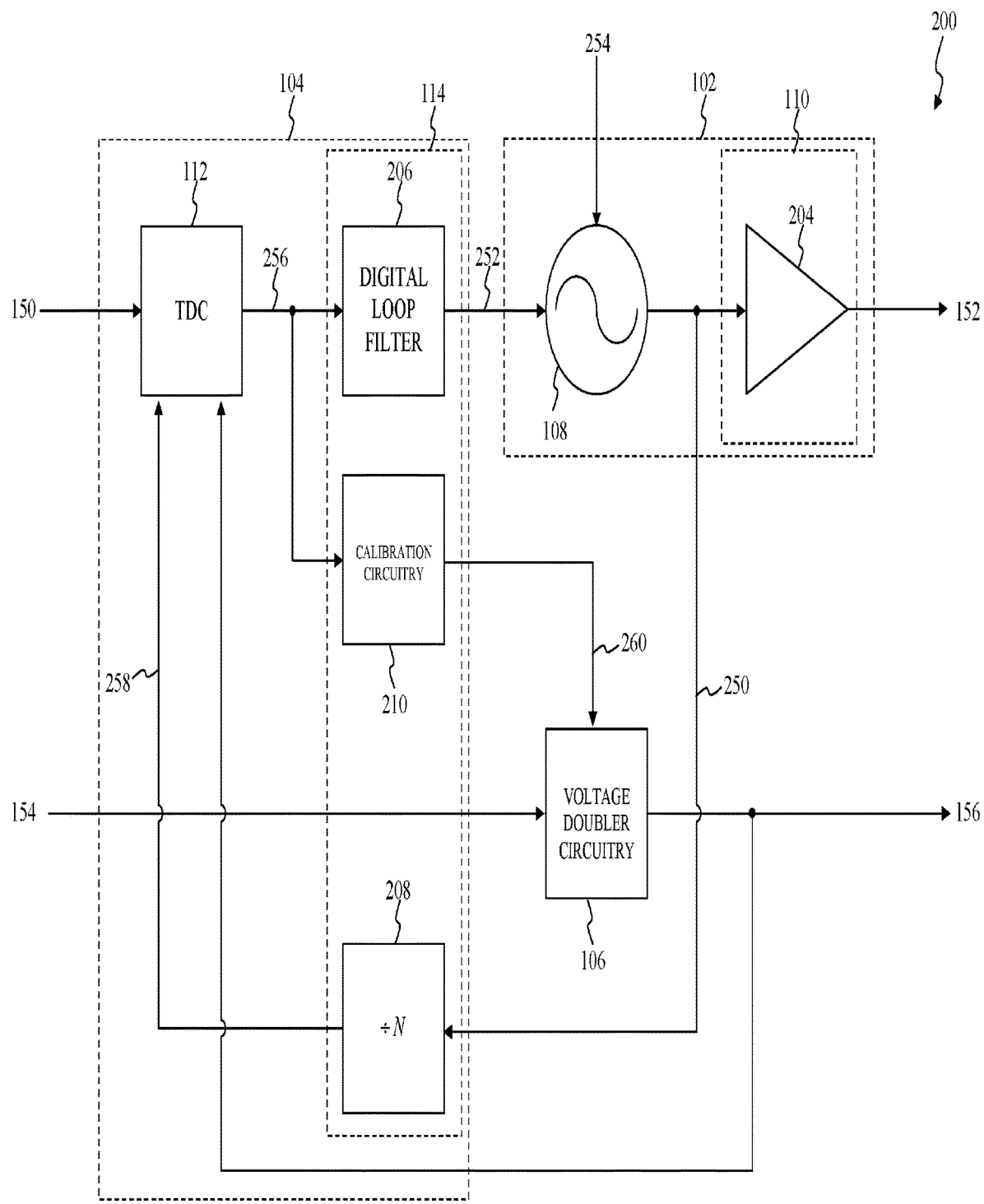
FIG. 2 further illustrates the block diagram of the ADPLL according to an exemplary embodiment of the present disclosure.

FIG. 2 further illustrates the block diagram of the ADPLL according to an exemplary embodiment of the present disclosure. An ADPLL 200 represents a closed-loop feedback control system for providing the output signal 152 which is proportional to the reference input signal 150. As illustrated in FIG. 2, the ADPLL 200 utilizes a combination of the analog circuitry 102 and the digital circuitry 104, as discussed above in FIG. 1, to cause the frequency $f_{OUT}$ and/or the phase $\phi_{OUT}$ of the output signal 152 to be proportional to the frequency $f_{REF}$ and/or the phase $\phi_{REF}$ of the reference input signal 150. In the exemplary embodiment illustrated in FIG. 2, the ADPLL 200 includes the analog circuitry 102, the digital circuitry 104, and the voltage doubler circuitry 106. The ADPLL 200 can represent an exemplary embodiment of the ADPLL 100 as discussed above in FIG. 1. It should be noted that various connections, which are not relevant to the discussion to follow, between the analog input supply voltage 154 and the analog circuitry 102 and between the digital input supply voltage 156 and the digital circuitry 104 as illustrated in FIG. 1 are not illustrated in FIG. 2 for convenience.

The analog circuitry 102 operates on time-varying signals within the ADPLL 200. In the exemplary embodiment illustrated in FIG. 2, the analog circuitry 102 includes the digital oscillator 108 and the other analog circuitry 110. The digital oscillator 108 adjusts a frequency $f_{OUT}$ and/or a phase $\phi_{OUT}$ of an output signal 250 in accordance with a fine digital tuning signal 252 and a coarse digital tuning signal 254. The coarse digital tuning signal 254 coarsely tunes the frequency $f_{OUT}$ to be within a locking range of the ADPLL 200. The locking range of the ADPLL 200 represents a range for the frequency $f_{OUT}$ of the output signal 250 that is sufficiently close to the frequency $f_{REF}$ of the reference input signal 150 such that the ADPLL 200 can lock onto the reference input signal 150 using the fine digital tuning signal 252. The fine digital tuning signal 252 can be used by the digital oscillator 108 to adjust the frequency $f_{OUT}$ and the phase $\phi_{OUT}$ to match variations in the frequency $f_{REF}$ and the phase $\phi_{REF}$ of the reference input signal 150. In an exemplary embodiment, the digital oscillator 108 is implemented using a digitally controlled oscillator (DCO); however, those skilled in the relevant art(s) will recognize that other implementation for the digital oscillator 108, such as a numerically controlled oscillator (NCO) or a direct digital synthesizer (DDS) to provide some examples, are possible without departing from the spirit and scope of the present disclosure. In another exemplary embodiment, the digital oscillator 108 can be implemented using the digital controlled oscillator as discussed in Kuo et. al, "A Fully Integrated 28 nm Bluetooth Low-Energy Transmitter with 36% System Efficiency at 3 dBm," European Solid-State Circuits Conference (ESS-CIRC), ESSCIRC 2015-41st (2015), which is incorporated herein by reference in its entirety.

As illustrated in FIG. 2, the other analog circuitry 110 includes an analog amplifier 204. The analog amplifier 204 amplifies the output signal 250 having the frequency $f_{OUT}$ and the phase $\phi_{OUT}$ to provide the output signal 152 having the frequency $f_{OUT}$ and the phase $\phi_{OUT}$. In an exemplary embodiment, the analog amplifier 204 is implemented using a buffer amplifier, such as a voltage buffer amplifier or a current buffer amplifier to provide some examples.

The digital circuitry 104 operates on discrete signals representing logical and/or numeric values within the ADPLL 200. In the exemplary embodiment illustrated in FIG. 2, the digital circuitry 104 includes the TDC 112 and the other digital circuitry 114 as described above in FIG. 1. In this exemplary embodiment, the other digital circuitry 114 includes a digital loop filter 206, a digital dividing circuitry 208, and calibration circuitry 210. The TDC 112 measures various timing characteristics between the reference input signal 150 and a clocking signal 258 to provide a digital phase error 256 representing a difference between the phase $\phi_{REF}$ of the reference input signal 150 and the phase $\phi_{OUT}$ of the clocking signal 258. For example, the TDC 112 measures a first start time of the reference input signal 150 and/or a first stop time of the reference input signal 150. In this example, the TDC 112 similarly measures a second start time of the clocking signal 258 and/or a second stop time of the clocking signal 258. Also in this example, the TDC 112 compares the first start time and the second start time and/or the first stop time and the second stop time to measure the difference between the phase $\phi_{REF}$ of the reference input signal 150 and the phase $\phi_{OUT}$ of the clocking signal 258 and provides a digital representation of this difference as the digital phase error 256. In the exemplary embodiment illustrated in FIG. 2, the TDC 112 receives operational power from the digital input supply voltage 156. As described above in FIG. 1, the PVT variations within the ADPLL 100 can cause the digital input supply voltage 156 to fluctuate, which in turn, can cause fluctuations in the resolution of the TDC 112. These fluctuations in the resolution of the TDC 112 can cause in-band phase noise of the ADPLL 100 to vary across the PVT variations. As to be described in further detail below, the other digital circuitry 114 includes calibration circuitry 210 to regulate the digital input supply voltage 156 to stabilize the resolution of the TDC 112 across the PVT variations. This stabilization of the resolution of the TDC 112 can cause the ADPLL 100 to maintain a fixed in-band phase noise across the PVT variations.

As additionally illustrated in FIG. 2, the other digital circuitry 114 includes a digital loop filter 206, digital dividing circuitry 208, and the calibration circuitry 210. The digital loop filter 206 provides the fine digital tuning signal 252 in response to the digital phase error 256. In an exemplary embodiment, the digital loop filter 206 is implemented using a digital low pass filter, such as a finite impulse response (FIR) low pass filter or an infinite impulse response (IIR) low pass filter to provide some examples. In this exemplary embodiment, the digital loop filter 206 suppresses high frequency components in the digital phase error 256 which are outside of its bandwidth to provide samples of a direct current (DC), or near DC, component of the digital phase error 256 within its bandwidth as the fine digital tuning signal 252.

The digital dividing circuitry 208 digitally divides the output signal 250 having the frequency $f_{OUT}$ and the phase $\phi_{OUT}$ to provide the clocking signal 258 having the frequency $f_{DIV}$ and the phase $\phi_{OUT}$. In the exemplary embodiment illustrated in FIG. 2, the digital dividing circuitry 208 is implemented as an integer frequency divider to digitally divide the frequency $f_{OUT}$ of the output signal by an integer N, such as two to provide an example, to provide the clocking signal 258 having the frequency $f_{DIV}$ and the phase $\phi_{DIV}$. However, those skilled in the relevant art(s) will recognize the digital dividing circuitry 208 can be implemented as a fractional frequency divider to digitally divides the frequency $f_{OUT}$ of the output signal by a non-integer F, such as two and two-thirds to provide an example, to provide the clocking signal 258 having the frequency $f_{DIV}$ and the phase $\phi_{DIV}$.

The calibration circuitry 210 regulates the digital input supply voltage 156 to stabilize the resolution of the TDC 112 across the PVT variations. In the exemplary embodiment illustrated in FIG. 2, the calibration circuitry 210 utilizes the digital phase error 256 to estimate the resolution of the TDC 112. In an exemplary embodiment, the resolution of the TDC 112 can be estimated using any well-known estimation mechanism that will be apparent to those skilled in the relevant art(s) without departing from the spirit and scope of the present disclosure. This well-known estimation mechanism can include the mechanism as described in U.S. patent application Ser. No. 12/134,081, filed Jun. 5, 2008, now U.S. Pat. No. 8,830,001, which is incorporated herein by reference in its entirety. Thereafter, the calibration circuitry 210 compares the estimated resolution of the TDC 112 to a target resolution for the TDC 112 and assigns a value to a voltage control signal 260 in response to this comparison. In an exemplary embodiment, the voltage control signal 260 causes the voltage doubler circuitry 106, having one or more switched capacitor circuits, to generate a switching clocking signal to charge and/or to discharge the one or more switched capacitor circuits to provide the digital input supply voltage 156 when the estimated resolution of the TDC 112 is less than or equal to the target resolution for the TDC 112. Otherwise, the voltage control signal 260 causes the voltage doubler circuitry 106 to skip one or more clocking cycles of the switching clocking signal to decrease the digital input supply voltage 156 when the estimated resolution of the TDC 112 is greater than or equal to the target resolution for the TDC 112. In this situation, the estimated resolution of the TDC 112 can be considered to be too fine when compared to the target resolution for the TDC 112.

Figure 3:
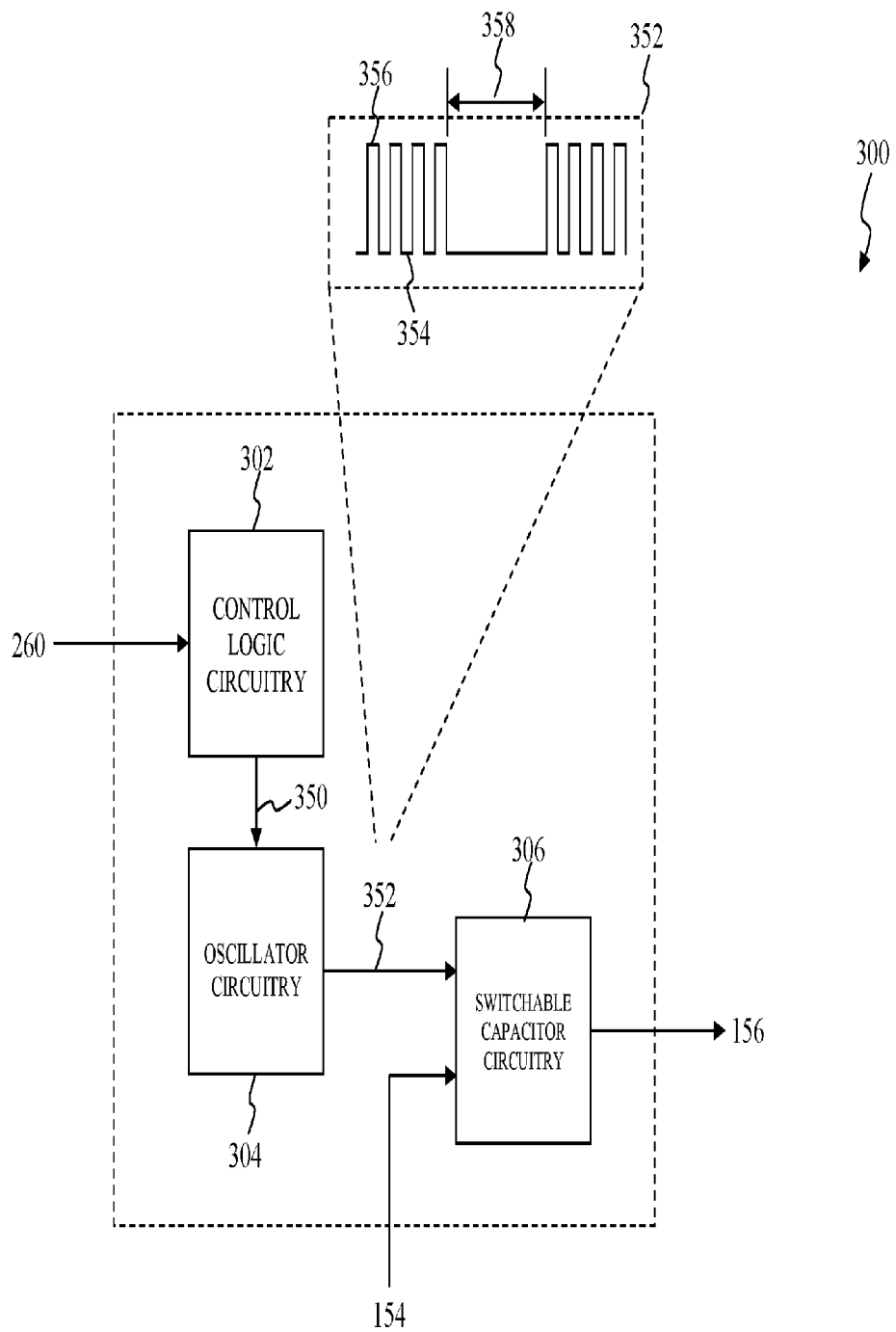
FIG. 3 illustrates a block diagram of first exemplary voltage doubler circuitry that can be implemented within the ADPLL according to an exemplary embodiment of the present disclosure.

In the exemplary embodiment illustrated in FIG. 3, the calibration circuitry 210 assigns the value to the voltage control signal 260 in accordance with a calibration table. An exemplary embodiment for the calibration table is shown below in TABLE 1.

TABLE 1

Exemplary Calibration Table

| voltage control signal 260 | resolution of the TDC 112 |
|---|---|
| 11 . . . 11 | 0.01 Unit Interval (UI) |
| 11 . . . 10 | 0.011 UI |
| . | . |
| . | . |
| . | . |
| 10 . . . 00 | 0.25 UI |
| . | . |
| . | . |
| . | . |
| 00 . . . 01 | 0.49 UI |
| 00 . . . 00 | ≥0.5 UI |

TABLE 1 illustrates the progression of the voltage control signal 260 from its maximum value of 11 . . . 11 to its minimum value 00 . . . 00 and corresponding values for the resolution for the TDC 112 between the maximum value and the minimum value. As illustrated by TABLE 1, the calibration circuitry 210 assigns the voltage control signal 260 to a value between 11 . . . 11 and 00 . . . 01 when a ratio between the estimated resolution of the TDC 112 and the target resolution for the TDC 112, expressed in unit intervals (UI), is between 0.01 UI and 0.49 UI. In this situation, the voltage control signal 260 causes the voltage doubler circuitry 106, having one or more switched capacitor circuits, to generate a switching clocking signal to charge and/or to discharge the one or more switched capacitor circuits to provide the digital input supply voltage 156. Otherwise, the calibration circuitry 210 assigns the voltage control signal 260 to a value of 00 . . . 00 when the ratio between the estimated resolution of the TDC 112 and the target resolution for the TDC 112 is greater than or equal to 0.50 UI. In this situation, the voltage control signal 260 causes the voltage doubler circuitry 106 to skip one or more clocking cycles of the switching clocking signal to decrease the digital input supply voltage 156.

As discussed above in FIG. 1, the voltage doubler circuitry 106 scales the analog input supply voltage 154 by the numerical factor, for example approximately two, to provide the digital input supply voltage 156. In the exemplary embodiment illustrated in FIG. 2, the voltage doubler circuitry 106 provides the switching clocking signal to activate, namely charge, and/or deactivate, namely discharge, the one or more switched capacitor circuits to provide the digital input supply voltage 156. The one or more switched capacitor circuits store energy from analog input supply voltage 154 when activated and discharge this stored energy when deactivated to provide the digital input supply voltage 156. In some situations, for example, when the voltage control signal 260 is at the value of 00 . . . 00, the voltage doubler circuitry 106 can skip one or more clocking cycles of the switching clocking signal to decrease the digital input supply voltage 156 to stabilize the resolution of the TDC 112 across the PVT variations.

Exemplary Voltage Doubler Circuitry

FIG. 3 illustrates a block diagram of first exemplary voltage doubler circuitry that can be implemented within the ADPLL according to an exemplary embodiment of the present disclosure. As illustrated in FIG. 3, voltage doubler circuitry 300 scales the analog input supply voltage 154 by the numerical factor to provide the digital input supply voltage 156. The voltage doubler circuitry 300 can include control logic circuitry 302, oscillator circuitry 304, and a switchable capacitor circuitry 306. The voltage doubler circuitry 300 can represent an exemplary embodiment of the voltage doubler circuitry 106.

The control logic circuitry 302 decodes the voltage control signal 260 to provide an oscillator circuitry control signal 350. In the exemplary embodiment illustrated in FIG. 3, the control logic circuitry 302 includes one or more logical gates, such as one or more logical AND gates, one or more logical OR gates, one or more logical INVERTER gates, one or more logical NAND gates, one or more logical NOR gates, or any combination thereof to provide some examples, to decode the voltage control signal 260 to provide the oscillator circuitry control signal 350. For example, from TABLE 1 above, the one or more logical gates provide the oscillator circuitry control signal 350 at a first logical level, such as a logical zero to provide an example, when the voltage control signal 260 is at 00 . . . 00. Otherwise in this example, the one or more logical gates provide the oscillator circuitry control signal 350 at a second logical level, such as a logical one to provide an example, when the voltage control signal 260 is between 11 . . . 11 and 00 . . . 01.

The oscillator circuitry 304 provides the switching clocking signal 352 when the oscillator circuitry control signal is at the first logical level or skips one or more clocking cycles of the switching clocking signal 352 when the oscillator circuitry control signal 350 is at the second logical level. In an exemplary embodiment, the oscillator circuitry 304 can include a feedback oscillator, such as an RC oscillator circuit, an LC oscillator circuit, or a crystal oscillator circuit; a negative resistance oscillator, such as a Clapp oscillator, a Colpitts oscillator, a Hartley oscillator, a Pierce oscillator, or a Wien bridge oscillator; or a relaxation oscillator, such as a multivibrator, a ring oscillator, or a delay line oscillator to provide some examples. The operation of the oscillator circuitry 304 is to be described using an enhanced view of the switching clocking signal 352 as illustrated in FIG. 3. As illustrated in the enhanced view of the switching clocking signal 352, the switching clocking signal 352 switches between a first logical level 354, such as a logical zero to provide an example, and a second logical level 356, such as a logical one to provide an example, when the oscillator circuitry 304 is at the first logical level. Otherwise, the switching clocking signal 352 skips one or more clocking skipped cycles 358 when the oscillator circuitry 304 is at the second logical level. As additionally illustrated in the enhanced view of the switching clocking signal 352, the switching clocking signal 352 is at the first logical level 354 during the one or more clocking skipped cycles 358.

The switchable capacitor circuitry 306 scales the analog input supply voltage 154 in accordance with the switching clocking signal 352 to provide the digital input supply voltage 156. In the exemplary embodiment illustrated in FIG. 3, the switchable capacitor circuitry 306 includes one or more switchable capacitors to provide the digital input supply voltage 156. The switching clocking signal 352 activates, namely charges, the one or more switchable capacitors when at the second logical level 356 and/or deactivates, namely discharges, the one or more switchable capacitors when at the first logical level 354 to provide the digital input supply voltage 156. The one or more switchable capacitors store energy when activated from analog input supply voltage 154 and discharge this stored energy when deactivated to provide the digital input supply voltage 156 at its current voltage level. In some situations, the switching clocking signal 352 deactivates, namely discharges, the one or more switchable capacitors when the one or more clocking skipped cycles 358 to decrease the digital input supply voltage 156 over a duration of the one or more clocking skipped cycles 358.

Figure 4:
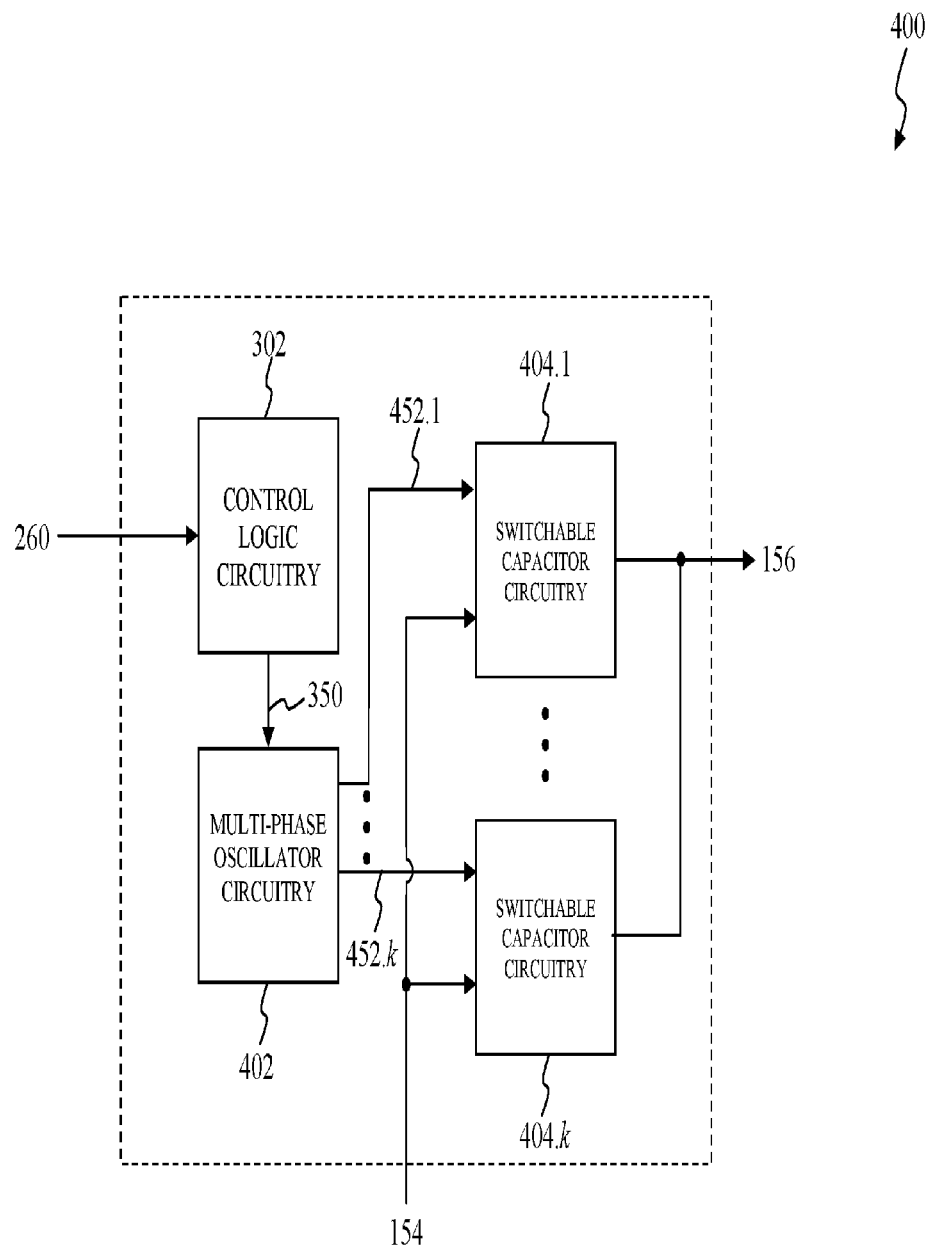
FIG. 4 illustrates a block diagram of second exemplary voltage doubler circuitry that can be implemented within the ADPLL according to an exemplary embodiment of the present disclosure.

FIG. 4 illustrates a block diagram of second exemplary voltage doubler circuitry that can be implemented within the ADPLL according to an exemplary embodiment of the present disclosure. Voltage doubler circuitry 400 scales the analog input supply voltage 154 by the numerical factor to provide the digital input supply voltage 156. The voltage doubler circuitry 400 can include the control logic circuitry 302, multi-phase oscillator circuitry 402, and switchable capacitor circuitry 404.1 through 404.$k$. The voltage doubler circuitry 400 can represent an exemplary embodiment of the voltage doubler circuitry 106.

The multi-phase oscillator circuitry 402 provides multiple phases 452.1 through 452.$k$ of a switching clocking signal, such as the switching clocking signal 352 to provide an example, when the oscillator circuitry control signal 350 is at the first logical level or skips the one or more clocking cycles of the multiple phases 452.1 through 452.$k$ of the switching clocking signal when the oscillator circuitry control signal 350 is at the second logical level. In the exemplary embodiment illustrated in FIG. 4, the multiple phases 452.1 through 452.$k$ of the switching clocking signal are offset by approximately $$\frac{\pi}{k}.$$

In an exemplary embodiment, the multiple phases 452.1 through 452.$k$ of the switching clocking signal include the multiple phases 452.1 and 452.2 of the switching clocking signal. In this exemplary embodiment, the multiple phases 452.1 and 452.2 of the switching clocking signal are offset by approximately $$\frac{\pi}{2}.$$

Also, in the exemplary embodiment illustrated in FIG. 4, the multiple phases 452.1 through 452.k of the switching clocking signal represents differential multiple phases 452.1 through 452.k of the switching clocking signal. In this exemplary embodiment, the multiple phases 452.1 through 452.k of the switching clocking signal include the multiple phases $452.1_{(+)}$ through $452.k_{(+)}$ of the switching clocking signal and with their complementary multiple phases $452.1_{(-)}$ through $452.k_{(-)}$ of the switching clocking signal which are offset from the multiple phases $452.1_{(+)}$ through $452.k_{(+)}$ of the switching clocking signal by approximately π.

The switchable capacitor circuitry 404.1 through 404.k scales the analog input supply voltage 154 in accordance with the multiple phases 452.1 through 452.k of the switching clocking signal to provide the digital input supply voltage 156. In the exemplary embodiment illustrated in FIG. 3, each of the switchable capacitor circuitry 404.1 through 404.k includes one or more switchable capacitors to provide the digital input supply voltage 156. The multiple phases 452.1 through 452.k of the switching clocking signal activates, namely charges, the one or more switchable capacitors of their corresponding switchable capacitor circuitry 404.1 through 404.k when at the second logical level, such as a logical one, and/or deactivates, namely discharges, the one or more switchable capacitors of their corresponding switchable capacitor circuitry 404.1 through 404.k when at a first logical level, such as a logical zero, to contribute to the digital input supply voltage 156. In some situations, the multiple phases 452.1 through 452.k of the switching clocking signal deactivate, namely discharge, their corresponding switchable capacitor circuitry 404.1 through 404.k when one or more clocking cycles of the multiple phases 452.1 through 452.k of the switching clocking signal have been skipped in response to the multi-phase oscillator circuitry 402 being disabled. In these situations, this discharge of the one or more switchable capacitors of the switchable capacitor circuitry 404.1 through 404.k decreases the digital input supply voltage 156.

Exemplary Operation of the Electronic Optimization Platform

Figure 5:
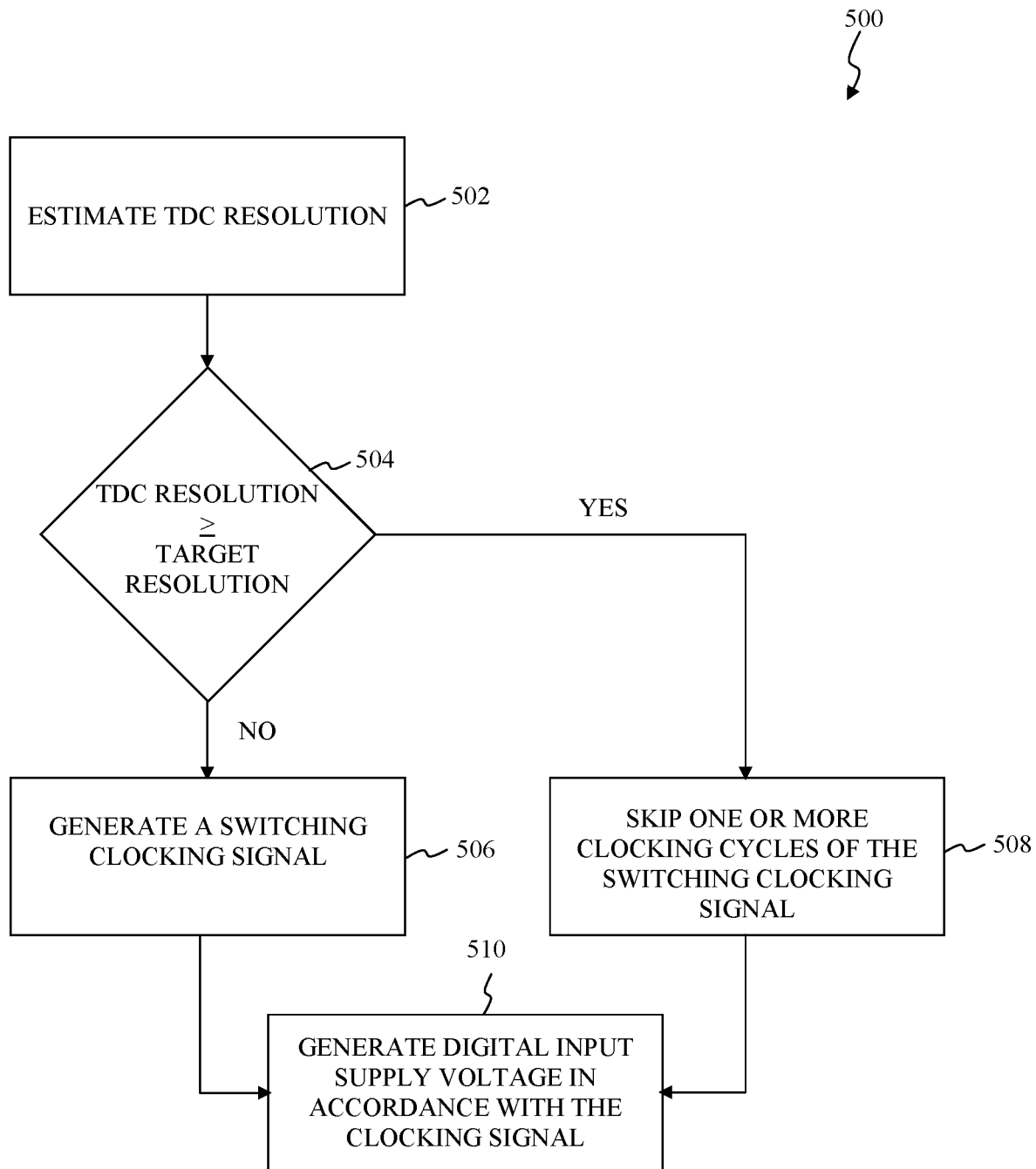
FIG. 5 illustrates a flowchart of an exemplary operation of the ADPLL according to an exemplary embodiment of the present disclosure.

FIG. 5 illustrates a flowchart of an exemplary operation of the ADPLL to compensate for process, voltage, and temperature (PVT) variations within the ADPLL according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 500 for a ADPLL, such as the ADPLL 100 and/or the ADPLL 200 to provide some examples, to compensate for process, voltage, and temperature (PVT) variations.

At operation 502, the exemplary operation flow 500 estimates a resolution of a time-to-digital converter (TDC) of the ADPLL. In an exemplary embodiment, the exemplary operation flow 500 can estimate the resolution of the TDC can be estimated using any well-known estimation mechanism that will be apparent to those skilled in the relevant art(s) without departing from the spirit and scope of the present disclosure. This well-known estimation mechanism can include the mechanism as described in U.S. patent application Ser. No. 12/134,081, filed Jun. 5, 2008, now U.S. Pat. No. 8,830,001, which is incorporated herein by reference in its entirety.

At operation 504, the exemplary operation flow 500 determines whether the resolution of the TDC estimated in operation 502 is greater than or equal to a target resolution for the TDC. The exemplary operation flow 500 proceeds to operation 506 when the TDC estimated in operation 502 is less than the target resolution for the TDC. Otherwise, the exemplary operation flow 500 proceeds to operation 508 when the TDC estimated in operation 502 is greater than or equal the target resolution for the TDC.

At operation 506, the exemplary operation flow 500 provides a switching clocking signal, such as the switching clocking signal 352 or the multiple phases 452.1 through 452.k of the switching clocking signal to provide some examples, that switches between a first logical level, such as a logical zero, and a second logical level, such as a logical one.

At operation 508, the exemplary operation flow 500 skips one or more clocking cycles of the switching clocking signal when the TDC estimated in operation 502 is greater than or equal the target resolution for the TDC.

At operation 510, the exemplary operation flow 500 charges and/or discharges one or more switched capacitor circuits, such as the switchable capacitor circuitry 306 or the switchable capacitor circuitry 404.1 through 404.k to provide some examples, in accordance with the switching clocking signal. The exemplary operation flow 500 discharges the one or more switched capacitor circuits when the switching clocking signal is at the first logical level, such as the logical zero, to increase a first analog supply voltage, such as the digital input supply voltage 156 to provide an example, and charges the one or more switched capacitor circuits when the switching clocking signal is at the second logical level, such as the logical one, using a second analog supply voltage, such as the analog input supply voltage 154 to provide an example. In an exemplary embodiment, the exemplary operation flow 500 discharges the one or more switched capacitor circuits when the switching clocking signal is at the first logical level for the duration of the duration of the one or more clocking cycles from operation 506 that have been skipped to regulate a digital input supply voltage to stabilize the resolution of the TDC across the PVT variations.

CONCLUSION

The foregoing Detailed Description discloses a phase locked loop (PLL). The PLL includes a time-to-digital converter (TDC), voltage doubler circuitry, and an oscillator. The TDC provides a phase error difference between a first signal and a second signal in response to receiving a supply voltage. The voltage doubler circuitry charges or discharges one or more switchable capacitors in accordance with a switching clocking signal to provide the supply voltage when a resolution of the TDC is less than a target resolution, and/or skips one or more cycles of the switching clocking signal when the resolution of the TDC is greater than or equal to the target resolution. The oscillator provides the second signal in response to the phase error difference.

The foregoing Detailed Description also discloses a method for operating all-digital phase locked loop (ADPLL). The method includes measuring a phase error difference between a first signal and a second signal, estimating a resolution of the time-to-digital converter (TDC) based upon the phase error difference, charging or discharging one or more switchable capacitors in accordance with a switching clocking signal to provide a supply voltage for the TDC when the resolution of the TDC is less than a target resolution, and skipping one or more cycles of the switching clocking signal when the resolution of the TDC is greater than or equal to the target resolution to stabilize the supply voltage across process, voltage, and temperature (PVT) variations in the ADPLL.

a phase error difference between a phase of a first signal and a phase of a second signal, estimating a resolution of a time-to-digital converter (TDC) with the PLL based upon the phase error difference, generating a switching clocking signal when the estimated resolution of the TDC is less than to a target resolution, the switching clocking signal switching between a first logical level and a second logical level, skipping one or more clocking cycles of the switching clocking signal when the estimated resolution of the TDC is greater than or equal to a target resolution, the switching clocking signal being at the first logical level for a duration of the one or more clocking cycles of the switching clocking signal, discharging one or more switched capacitor circuits when the switching clocking signal is at the first logical level; and charging the one or more switched capacitor circuits when the switching clocking signal is at the second logical level.

The foregoing Detailed Description further disclose another phase locked loop (PLL). The system includes a time-to-digital converter (TDC), voltage doubler circuitry, and an oscillator. The TDC provides a phase error difference between a first signal and a second signal in response to receiving a supply voltage. The resolution of the TDC fluctuates in response to process, voltage, and temperature (PVT) variations in the PLL. The voltage doubler circuitry regulates the supply voltage to stabilize the resolution of the TDC across the PVT variations. The oscillator provides the second signal in response to the phase error difference.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A system for generating an input voltage within a phase locked loop (PLL) having a time-to-digital converter (TDC), the system comprising:
    an oscillator configured to:
        generate a switching clocking signal when a resolution of the TDC is less than or equal to a target resolution for the TDC, and
        skip one or more clocking cycles of the switching clocking signal when the resolution of the TDC is greater than the target resolution for the TDC; and
    one or more switchable capacitors configured to be charged or discharged in response to the switching clocking signal to generate the input voltage.

2. The system of claim 1, wherein the oscillator is further configured to receive an oscillator circuitry control signal at a first logical level when the resolution of the TDC is less than the target resolution and at a second logical level when the resolution of the TDC is greater than or equal to the target resolution,
    wherein the oscillator is configured to generate the switching clocking signal when the oscillator circuitry control signal is at the first logical level, and
    wherein the oscillator is configured to skip the one or more clocking cycles of the switching clocking signal when the oscillator circuitry control signal is at the second logical level.

3. The system of claim 2, wherein the one or more switchable capacitors are configured to be charged in response to the switching clocking signal being at the first logical level and to be discharged in response to the switching clocking signal being at the second logical level.

4. The system of claim 1, wherein the oscillator is configured to cease providing the switching clocking signal when the resolution of the TDC is greater than the target resolution for the TDC to skip the one or more clocking cycles of the switching clocking signal.

5. The system of claim 1, wherein the oscillator is configured to skip the one or more clocking cycles of the switching clocking signal to decrease the input voltage.

6. The system of claim 1, wherein the input voltage is a digital input supply voltage, and
wherein the one or more switchable capacitors are configured to be charged using an analog input supply voltage or discharged to generate the digital input supply voltage.

7. The system of claim 6, wherein the one or more switchable capacitors are configured to scale the analog input supply voltage by a numerical factor to provide the digital input supply voltage.

8. A method for compensating for process, voltage, and temperature (PVT) variations within a phase locked loop (PLL), the method comprising:
estimating, by the PLL, a resolution of a time-to-digital converter (TDC) with the PLL, the resolution of the TDC being dependent upon an input voltage which fluctuates based upon the PVT variations in the PLL;
generating, by the PLL, a switching clocking signal, the generating comprising skipping one or more clocking cycles of the switching clocking signal when the resolution of the TDC is greater than a target resolution; and
generating, by the PLL, the input voltage signal based upon discharging or charging one or more switched capacitor circuits in response to the switching clocking signal.

9. The method of claim 8, further comprising:
receiving an oscillator circuitry control signal at a first logical level when the resolution of the TDC is less than the target resolution and at a second logical level when the resolution of the TDC is greater than or equal to the target resolution, and
wherein the generating the switching clocking signal comprises:
generating the switching clocking signal when the oscillator circuitry control signal is at the first logical level; and
skipping the one or more clocking cycles of the switching clocking signal when the oscillator circuitry control signal is at the second logical level.

10. The method of claim 9, wherein the generating the input voltage signal comprises:
charging the one or more switchable capacitors in response to the switching clocking signal being at the first logical level; and
discharging the one or more switchable capacitors in response to the switching clocking signal being at the second logical level.

11. The method of claim 8, wherein the generating the switching clocking signal comprises:
ceasing to provide the switching clocking signal when the resolution of the TDC is greater than the target resolution for the TDC to skip the one or more clocking cycles of the switching clocking signal.

12. The method of claim 8, wherein the generating the switching clocking signal comprises:
skipping the one or more clocking cycles of the switching clocking signal to decrease the input voltage.

13. The method of claim 8, wherein the input voltage is a digital input supply voltage, and
wherein the generating the input voltage signal comprises:
charging the one or more switchable capacitors using an analog input supply voltage or discharging the one or more switchable capacitors to generate the digital input supply voltage.

14. The method of claim 13, wherein the generating the input voltage signal further comprises:
scaling the analog input supply voltage by a numerical factor to provide the digital input supply voltage.

15. A system for compensating for process, voltage, and temperature (PVT) variations within a phase locked loop (PLL) having a time-to-digital converter (TDC), the system comprising:
an oscillator configured to generate a switching clocking signal, the oscillator being further configured to skip one or more clocking cycles of the switching clocking signal when a resolution of the TDC is greater than a target resolution, the resolution of the TDC being dependent upon an input voltage which fluctuates based upon the PVT variations in the PLL; and
one or more switchable capacitors configured to charge or discharge in response to the switching clocking signal to generate the input voltage.

16. The system of claim 15, wherein the oscillator is further configured to receive an oscillator circuitry control signal at a first logical level when the resolution of the TDC is less than the target resolution and at a second logical level when the resolution of the TDC is greater than or equal to the target resolution,
wherein the oscillator is configured to generate the switching clocking signal when the oscillator circuitry control signal is at the first logical level, and
wherein the oscillator is configured to skip the one or more clocking cycles of the switching clocking signal when the oscillator circuitry control signal is at the second logical level.

17. The system of claim 16, wherein the one or more switchable capacitors are configured to be charged in response to the switching clocking signal being at the first logical level and to be discharged in response to the switching clocking signal being at the second logical level.

18. The system of claim 15, wherein the oscillator is configured to cease providing the switching clocking signal when the resolution of the TDC is greater than the target resolution for the TDC to skip the one or more clocking cycles of the switching clocking signal.

19. The system of claim 15, wherein the oscillator is configured to skip the one or more clocking cycles of the switching clocking signal to decrease the input voltage.

20. The system of claim 15, wherein the input voltage is a digital input supply voltage, and
wherein the one or more switchable capacitors are configured to be charged using an analog input supply voltage or discharged to generate the digital input supply voltage.

* * * * *